United States Patent
Chang et al.

(10) Patent No.: US 9,647,650 B2
(45) Date of Patent: May 9, 2017

(54) CLOCK GENERATING DEVICE

(71) Applicant: CHROMA ATE INC., Taoyuan (TW)

(72) Inventors: Cheng-Hsien Chang, Taoyuan (TW);
Ching-Hua Chu, Taoyuan (TW);
Shin-Wen Lin, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 0 days.

(21) Appl. No.: 14/971,044

(22) Filed: Dec. 16, 2015

(65) Prior Publication Data

US 2016/0191032 A1    Jun. 30, 2016

(30) Foreign Application Priority Data

Dec. 31, 2014 (TW) .............................. 103146606 A

(51) Int. Cl.
*H03K 5/135* (2006.01)
*G06F 1/04* (2006.01)
*H03K 5/00* (2006.01)

(52) U.S. Cl.
CPC .............. *H03K 5/135* (2013.01); *G06F 1/04* (2013.01); *H03K 2005/00078* (2013.01)

(58) Field of Classification Search
CPC . H03K 5/135; H03K 2005/00078; G06F 1/04
USPC ....................................................... 327/261
See application file for complete search history.

(56) References Cited

U.S. PATENT DOCUMENTS

| | | | | |
|---|---|---|---|---|
| 7,061,224 B2* | 6/2006 | Kakizawa | ............ | G01R 25/005 324/76.54 |
| 7,215,596 B2* | 5/2007 | Jeong | ....................... | G11C 7/22 327/147 |
| 7,839,191 B2* | 11/2010 | Takai | ....................... | H03K 5/13 327/149 |
| 7,936,195 B2* | 5/2011 | Kim | ....................... | H03L 7/0814 327/149 |
| 8,912,837 B2* | 12/2014 | De Caro | ................ | H03K 5/131 327/158 |
| 2003/0218486 A1* | 11/2003 | Kwak | ................... | H03K 5/1565 327/158 |
| 2006/0238227 A1* | 10/2006 | Kim | ....................... | H03L 7/0814 327/158 |
| 2007/0147564 A1* | 6/2007 | Fan | ........................ | H03H 11/16 375/355 |
| 2007/0194825 A1* | 8/2007 | Song | ..................... | H03L 7/0812 327/158 |
| 2008/0297216 A1* | 12/2008 | Chiang | .............. | G01R 31/3016 327/158 |

(Continued)

*Primary Examiner* — Ryan Jager
(74) *Attorney, Agent, or Firm* — Locke Lord LLP; Tim Tingkang Xia, Esq.

(57) ABSTRACT

A clock generating device includes a first timing delay module, a multiplexer, and a second timing delay module. The multiplexer is electrically connected to the first timing delay module. The second timing delay module is electrically connected to the multiplexer. The first timing delay module generates a plurality of delayed clock signals based on a reference clock signal. The multiplexer outputs a first delayed clock signal and a second delayed clock signal, among the plurality of delayed clock signals, based on a clock generating signal. The second timing delay module generates an output clock signal based on the clock generating signal, the first delayed clock signal and the second delayed clock signal.

7 Claims, 10 Drawing Sheets

(56) References Cited

U.S. PATENT DOCUMENTS

| | | | |
|---|---|---|---|
| 2010/0079180 A1* | 4/2010 | Kim | H03K 5/13 |
| | | | 327/158 |
| 2010/0226188 A1* | 9/2010 | Kim | G11C 7/22 |
| | | | 365/194 |
| 2011/0109357 A1* | 5/2011 | Kim | H03L 7/0814 |
| | | | 327/158 |
| 2011/0291718 A1* | 12/2011 | Lee | H03L 7/0814 |
| | | | 327/158 |
| 2016/0056949 A1* | 2/2016 | Chattopadhyay | H04L 7/0025 |
| | | | 375/355 |

* cited by examiner

CLOCK GENERATING DEVICE

CROSS-REFERENCE TO RELATED APPLICATIONS

This non-provisional application claims priority under 35 U.S.C. §119(a) on Patent Application No(s). 103146606 filed in Taiwan, R.O.C. on Dec. 31, 2014, the entire contents of which are hereby incorporated by reference.

TECHNICAL FIELD

The disclosure relates to a clock generating device, more particularly to a clock generating device having a high linearity.

BACKGROUND

Delay-locked loops (DLLs) stand at an important position in the recent integrated circuit field. Please refer to FIG. 1, which is a schematic circuit structure of a conventional delay-locked loop in part. The conventional delay-locked loop uses a serial of delay components, also known as delay cells, to delay the time points of the rising edge (also known as the positive edge) and/or falling edge (also known as the negative edge) of a signal. Also, a multiplexer is used to select the output of one of the delay components to be an output signal of the delay-locked loop. The minimum resolution of this conventional delay-locked loop is greater than or equal to a propagation delay of one delay component, and the conventional delay-locked loop can not provide a smaller resolution. Therefore, such delay-locked loops cannot be applied to some specific application fields.

SUMMARY

According to one or more embodiments, the disclosure provides a clock generating device. In one embodiment, the clock generating device includes a first timing delay module, a multiplex module, and a second timing delay module. The multiplex module is electrically connected to the first timing delay module, and the second timing delay module is electrically connected to the multiplex module. The first timing delay module generates a plurality of delayed clock signals according to a reference clock signal. The multiplex module generates a first delayed clock signal and a second delayed clock signal among the plurality of delayed clock signals according to a clock generating signal. The second timing delay module generates an output clock signal according to the first and second delayed clock signals and the clock generating signal.

One or more embodiments of the clock generating device in the disclosure employ the multiplex module to select two of delayed clock signals and output them to the second timing delay module. Then, the second timing delay module generates the output clock signal according to the two delayed clock signals. Therefore, the clock generating device may provide a clock signal having a high linearity.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
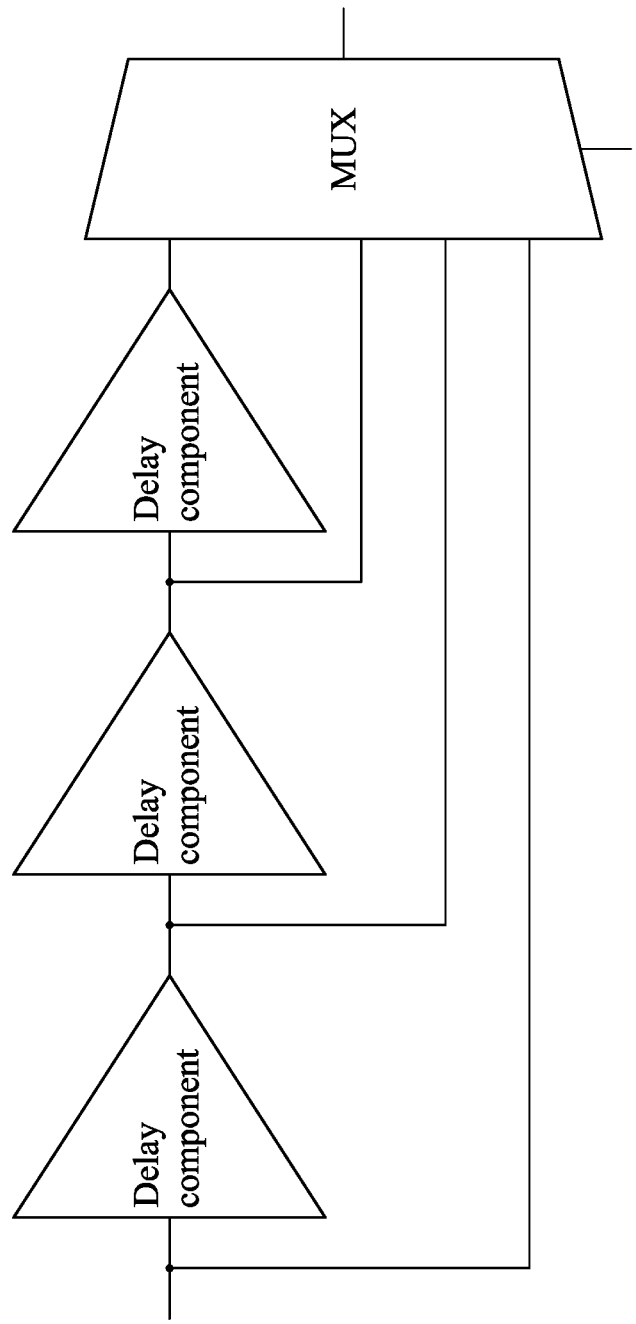
FIG. 1 is a schematic circuit structure of a conventional delay-locked loop in part.
Figure 2:
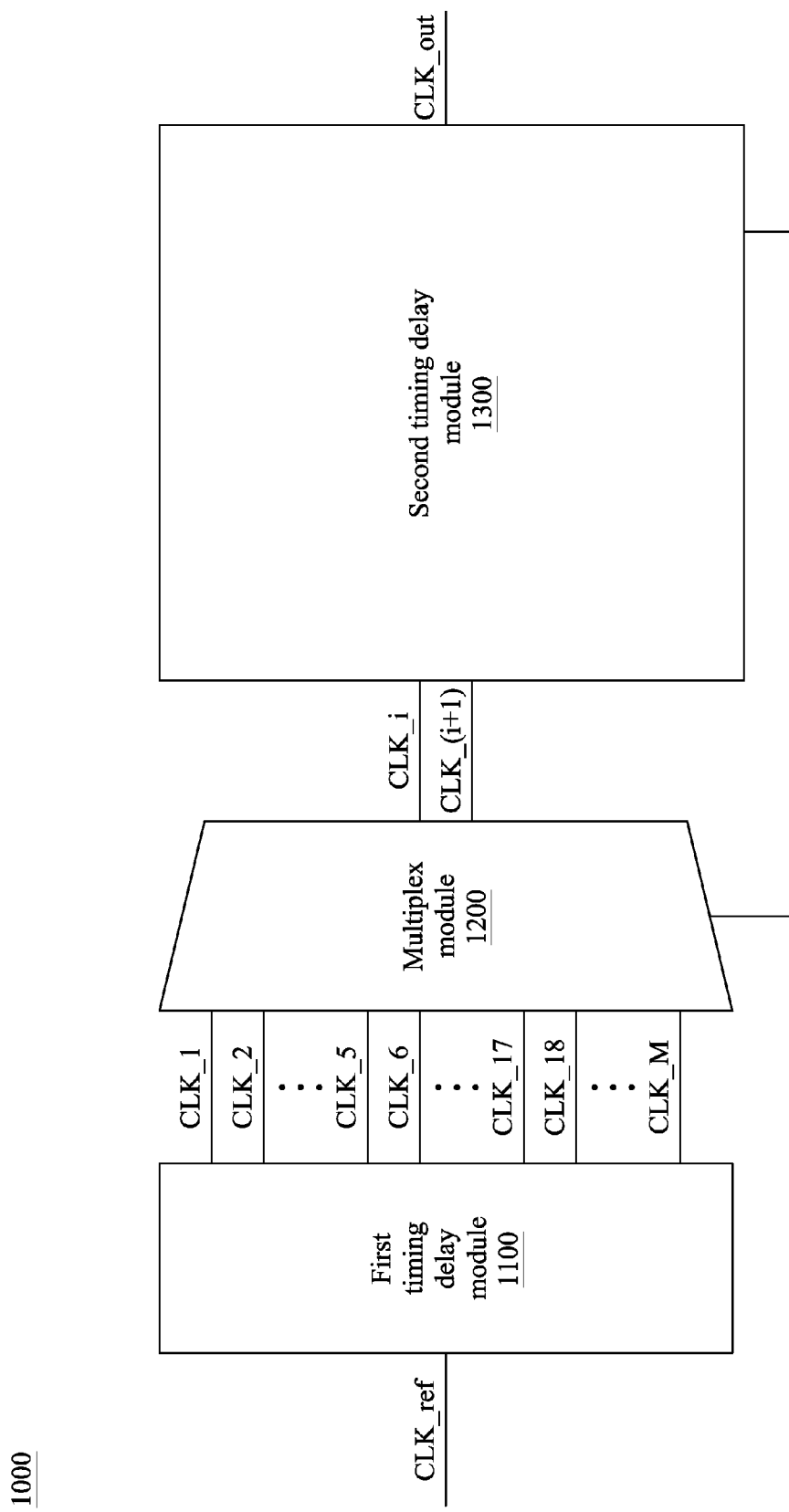
FIG. 2 is a functional block diagram of a clock generating device according to an embodiment.

Please refer to FIG. 2, which is a functional block diagram of a clock generating device 1000 according to an embodiment. The clock generating device 1000 includes a first timing delay module 1100, a multiplex module 1200, and a second timing delay module 1300. The multiplex module 1200 is electrically connected to the first timing delay module 1100, and second timing delay module 1300 is electrically connected to the multiplex module 1200.

Figure 3:
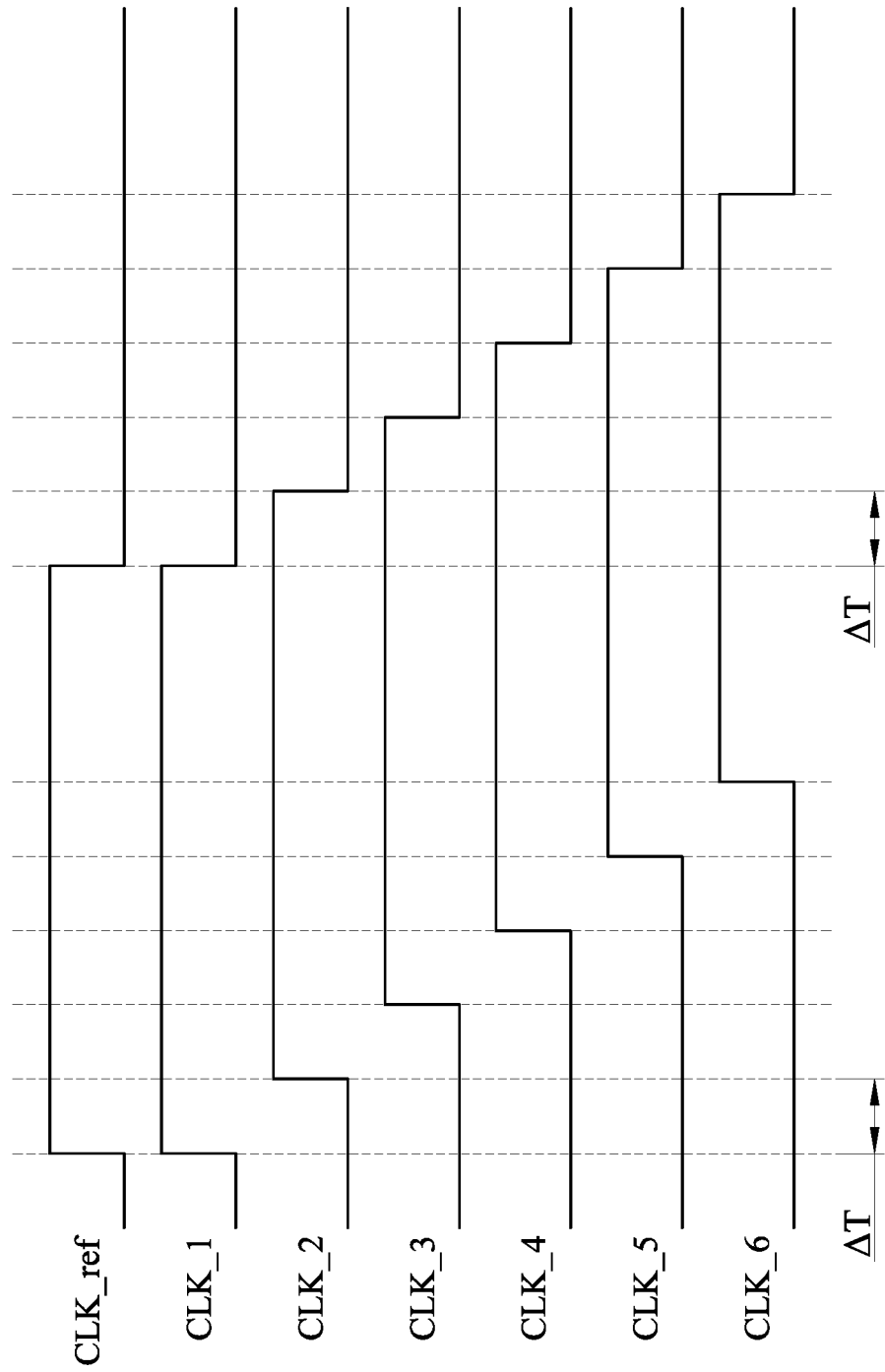
FIG. 3 is a schematic timing diagram of a reference clock signal and delayed clock signals according to an embodiment, and the delayed clock signals are generated by the first timing delay module when the first timing delay module receives the reference clock signal.

The first timing delay module 1100 generates delayed clock signals $CLK\_1$ to $CLK\_M$ associated with a reference clock signal $CLK\_ref$ according to the reference clock signal $CLK\_ref$. In other words, the first timing delay module 1100 generates M pieces of delayed clock signals according to the reference clock signal $CLK\_ref$, and M is a positive integer larger than 1. For example, the first timing delay module 1100 is a delay-locked loop (DLL). In an exemplary embodiment, as shown in FIG. 3, the delayed clock signal $CLK\_1$ among the 33 delayed clock signals outputted by the first timing delay module 1100 is synchronous to the reference clock signal $CLK\_ref$ chronologically. As compared to the delayed clock signal $CLK\_1$, the rising edge and/or falling edge of the delayed clock signal $CLK\_2$ delays by a time difference $\Delta T$. Similarly, the rising edge and/or falling edge of the delayed clock signal $CLK\_4$ delays by a time difference $\Delta T$ as compared to the delayed clock signal $CLK\_3$, and the rising edge and/or falling edge of the delayed clock signal $CLK\_6$ delays a time difference $\Delta T$ as compared to the delayed clock signal $CLK\_5$. In practice, the disclosure has no limit on the amount of delayed clock signals generated and outputted by the first timing delay module 1100.

The multiplex module 1200 outputs a first delayed clock signal CLK_i and a second delayed clock signal CLK_(i+1) among the delayed clock signals CLK_1 to CLK_M according to a clock generating signal CLK_gen. In other words, the multiplex module 1200 outputs the ith one and the (i+1)th one of the delayed clock signals CLK_1 to CLK_M according to the clock generating signal CLK_gen.

In an exemplary embodiment based on the first timing delay module 1100 generating 33 delayed clock signals (i.e. the delayed clock signals CLK_1 to CLK_33), the clock generating signal CLK_gen has 7 bits. Then, the multiplex module 1200 outputs the ith and (i+1)th ones of the 32 delayed clock signals according to 5 high bits of the 7-bit clock generating signal CLK_gen. In an example, if the 5 high bits of the clock generating signal CLK_gen is 00000, the multiplex module 1200 will output the delayed clock signal CLK_1 and the delayed clock signal CLK_2. In another example, if the 5 high bits of the clock generating signal CLK_gen is 00100, the multiplex module 1200 will output the delayed clock signal CLK_5 and the delayed clock signal CLK_6. In another example, if the 5 high bits of the clock generating signal CLK_gen is 10000, the multiplex module 1200 will output the delayed clock signal CLK_17 and the delayed clock signal CLK_18.

Specifically, the clock generating signal CLK_gen has a plurality of bits, and each bit indicates binary information. Each bit is either a high bit or a low bit, that is, (x+y) bits include x high bits and y low bits. Therefore, the multiplex module 1200 chronologically selects two sequential delayed clock signals from the M delayed clock signals according to the x high bits of the (x+y) bits of the clock generating signal CLK_gen and outputs them.

Figure 4:
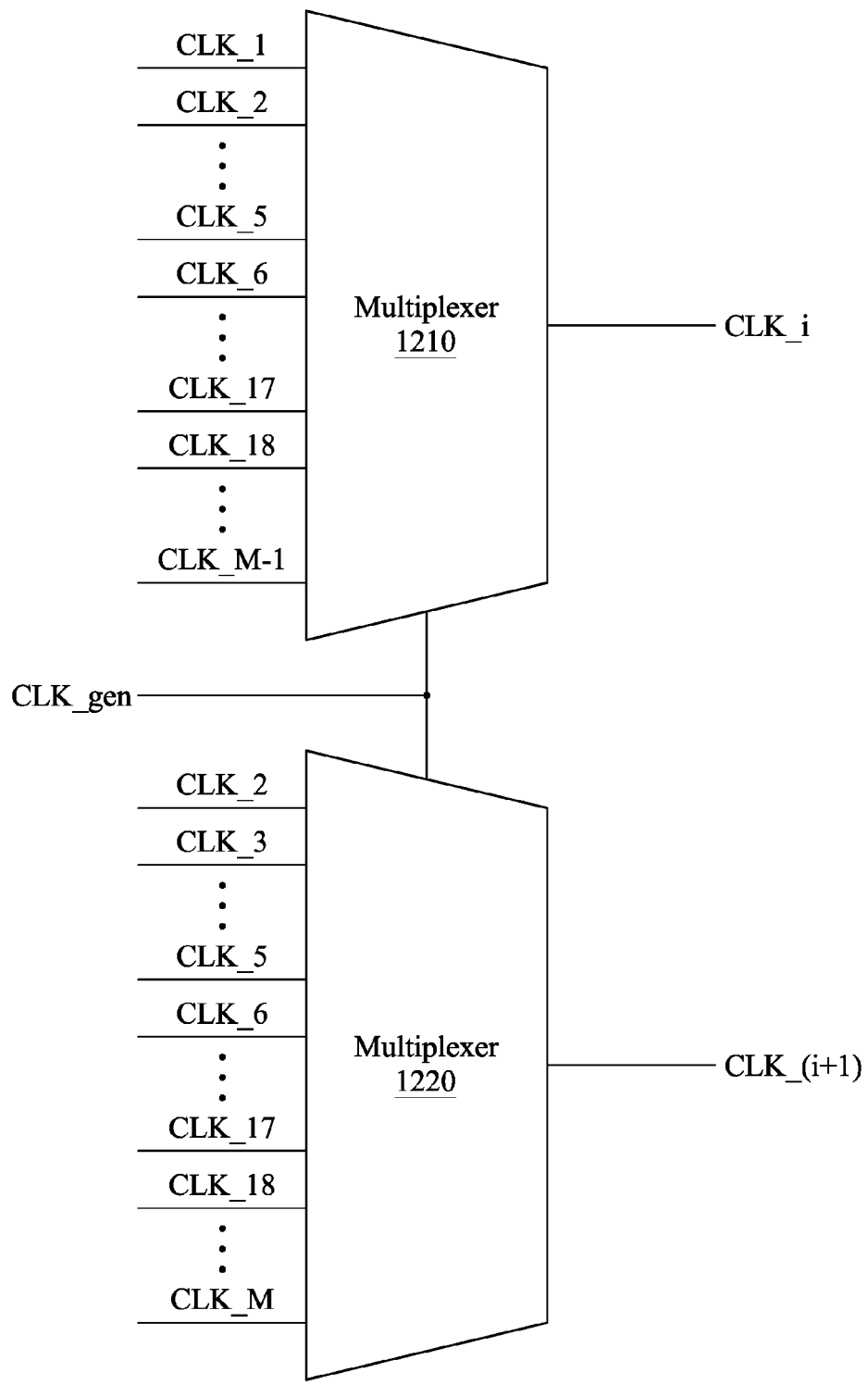
FIG. 4 is a schematic circuit diagram of the multiplex module according to an embodiment.

The multiplex module 1200 includes two multiplexers, i.e. a 32-to-1 multiplexer 1210 and a 32-to-1 multiplexer 1220, as shown in FIG. 4, which is a schematic circuit diagram of the multiplex module 1200 according to an embodiment. In the aforementioned embodiment of the first timing delay module 1100 outputting the delayed clock signals CLK_1 to CLK_33, the 32 input ends of the multiplexer 1210 receive the delayed clock signals CLK_1 to CLK_32, respectively, and the 32 input ends of the multiplexer 1220 receive the delayed clock signals CLK_2 to CLK_33. The signals received by the multiplexers 1210 and 1220 for selection control are the x high bits of the clock generating signal CLK_gen.

Figure 5:
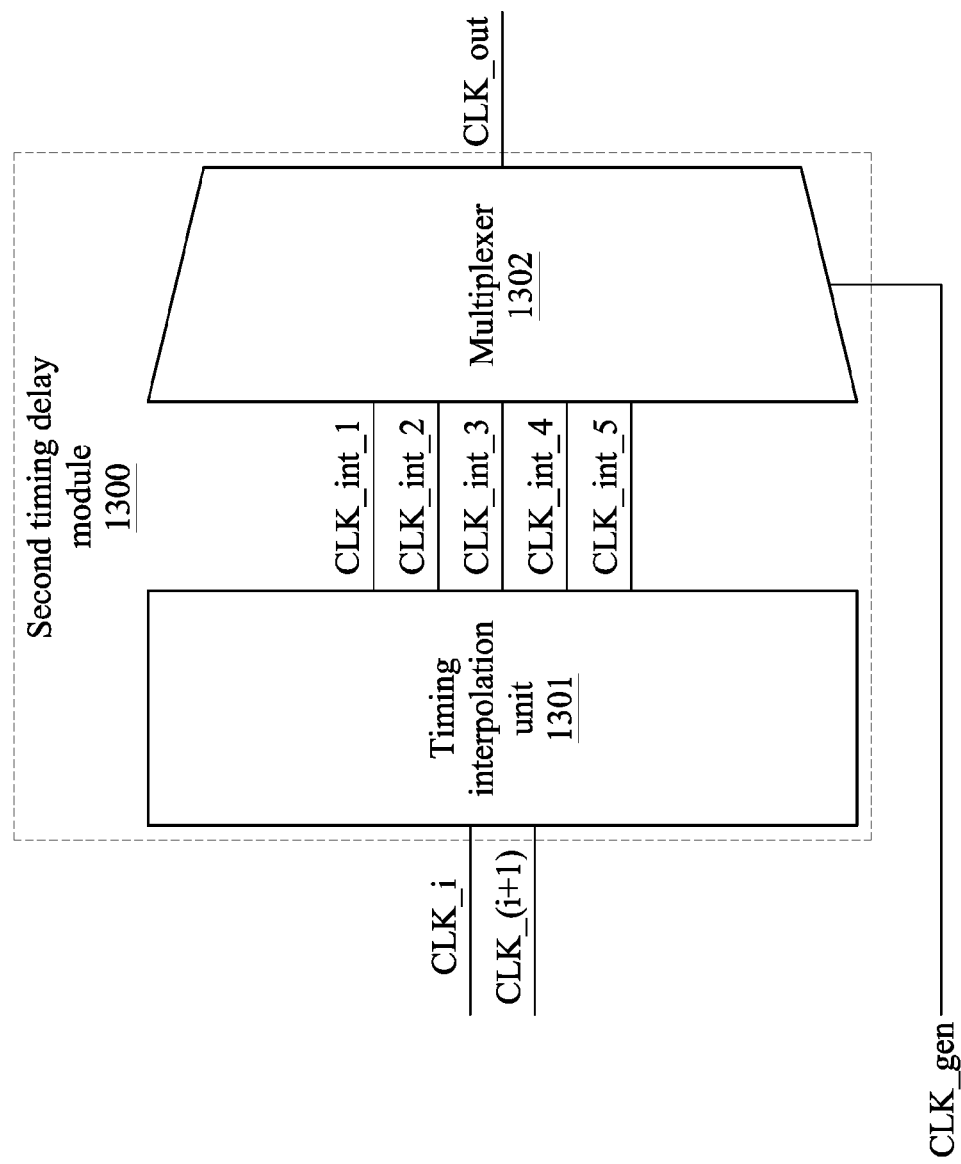
FIG. 5 is a functional block diagram of the second timing delay module according to an embodiment.

The second timing delay module 1300 generates an output clock signal CLK_out according to the first delayed clock signal, the second delayed clock signal and the clock generating signal. In an embodiment, the second timing delay module 1300 includes a timing interpolation unit 1301 and a multiplexer 1302, as shown in FIG. 5, which is a functional block diagram of the second timing delay module 1300. The timing interpolation unit 1301 is electrically connected to the multiplex module 1200, and the multiplexer 1302 is electrically connected to the timing interpolation unit 1301.

Figure 6A:
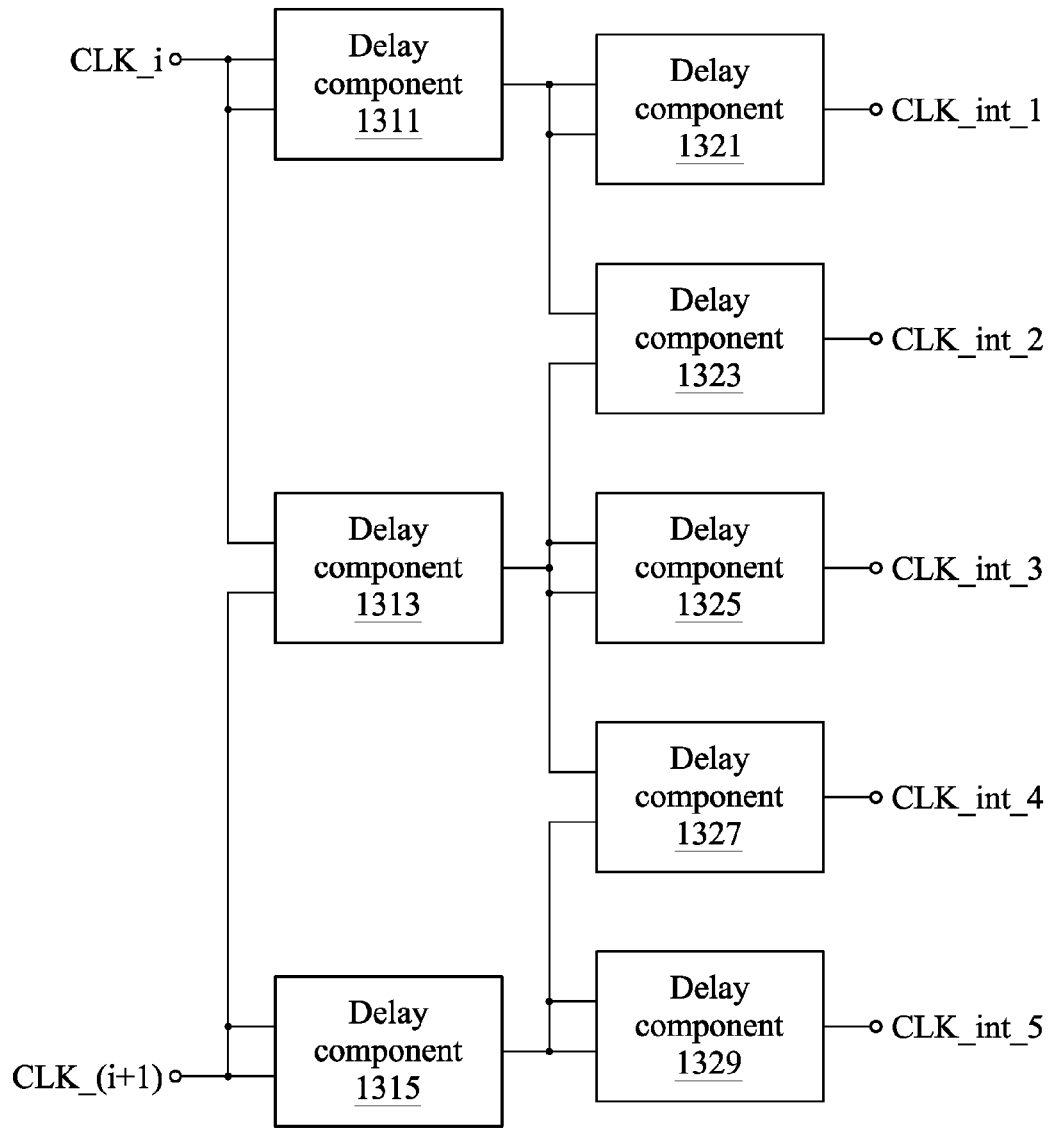
FIG. 6A is a schematic circuit diagram of the timing interpolation unit according to an embodiment.
Figure 6B:
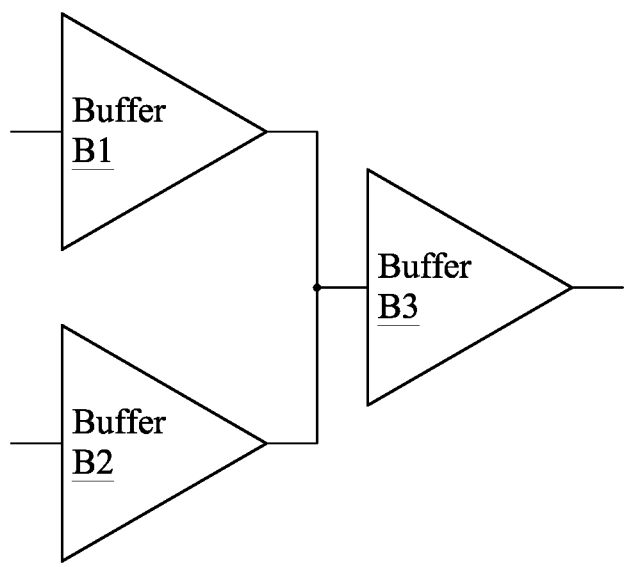
FIG. 6B is a schematic circuit diagram of the delay component in FIG. 6A according to an embodiment.
Figure 6C:
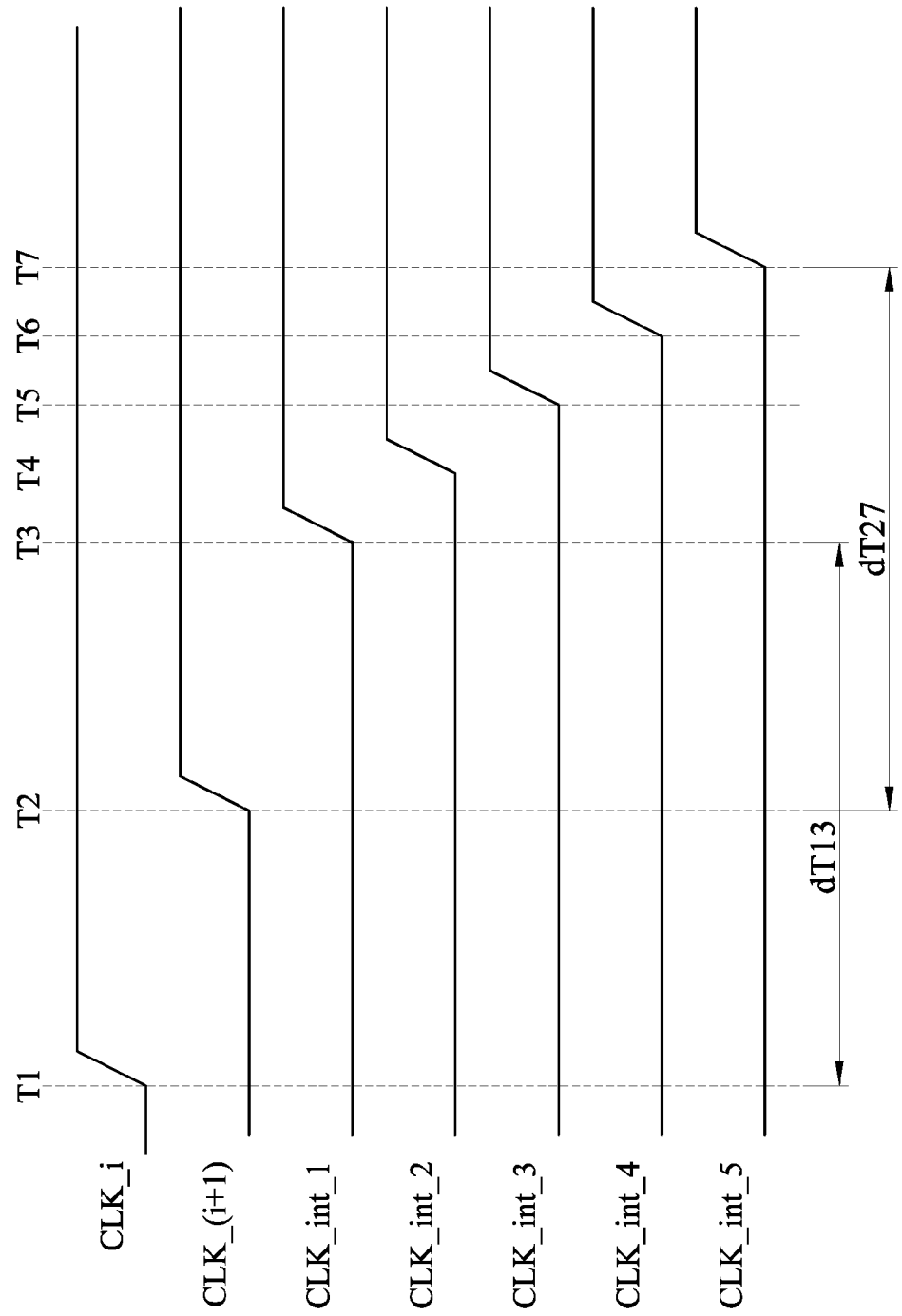
FIG. 6C is a schematic timing diagram of input and output signals of the timing interpolation unit according to an embodiment.

When the timing interpolation unit 1301 receives the delayed clock signal CLK_i, i.e. the first delayed clock signal, and the delayed clock signal CLK_(i+1), i.e. the second delayed clock signal, the timing interpolation unit 1301 generates five interpolation clock signals, i.e. interpolation clock signals CLK_int_1 to CLK_int_5. Please refer to FIG. 6A to FIG. 6C, where FIG. 6A is a schematic circuit diagram of the timing interpolation unit according to an embodiment, FIG. 6B is a schematic circuit diagram of the delay component in FIG. 6A according to an embodiment, and FIG. 6C is a schematic timing diagram of input and output signals of the timing interpolation unit according to an embodiment. The timing interpolation unit 1301, as shown in FIG. 6A, is an interpolation circuit and includes a delay component 1311, a delay component 1313, a delay component 1315, a delay component 1321, a delay component 1323, a delay component 1325, a delay component 1327, and a delay component 1329. Both the delay components 1321 and 1323 are electrically connected to the delay component 1311, the delay components 1323, 1325 and 1327 all are electrically connected to the delay component 1313, and the delay components 1327 and 1329 both are electrically connected to the delay component 1315.

Specifically, two input ends of the delay component 1311 receive the first delayed clock signal CLK_i, two input ends of the delay component 1315 receive the second delayed clock signal CLK_(i+1), two input ends of the delay component 1313 receive the first delayed clock signal CLK_i and the second delayed clock signal CLK_(i+1) respectively. Two input ends of the delay component 1321 receive the output of the delay component 1311, two input ends of the delay component 1325 receive the output of the delay component 1313, two input ends of the delay component 1329 receive the output of the delay component 1315. Two input ends of the delay component 1323 receive the output of the delay component 1311 and the output of the delay component 1313, respectively. Two input ends of the delay component 1327 receive the output of the delay component 1313 and the output of the delay component 1315, respectively.

These delay components have the same internal circuit structure like the delay component 1311 shown in FIG. 6B. The delay component 1311 includes a first buffer B1, a second buffer B2, and a third buffer B3. The output end of the first buffer B1 and the output end of the second buffer B2 are coupled to the input end of the third buffer B3. Through the aforementioned circuit structure of the delay component and the connections of delay components in the timing interpolation unit 1301 in this embodiment, there can be a plurality of interpolation clock signals generated according to the delayed clock signal CLK_i and the delayed clock signal CLK_(i+1), and every two sequential interpolation clock signals may have the same or similar time difference therebetween.

As shown in FIG. 6C, at the first time point T1, the delayed clock signal CLK_i starts to change from a low voltage to a high voltage. At the second time point T2, the delayed clock signal CLK_(i+1) start to change from a low voltage to a high voltage. At the third time point T3, the interpolation clock signal CLK_int_1 starts to change from a low voltage to a high voltage. At the forth time point T4, the interpolation clock signal CLK_int_2 starts to change from a low voltage to a high voltage. At the fifth time point T5, the interpolation clock signal CLK_int_3 starts to change from a low voltage to a high voltage. At the sixth time point T6, the interpolation clock signal CLK_int_4 starts to change from a low voltage to a high voltage. At the seventh time point T7, the interpolation clock signal CLK_int_5 starts to change from a low voltage to a high voltage. The time difference dT13 between the first time point T1 and the third time point T3 is equivalent to the time difference dT27 between the second time point T2 and the seventh time point T7. The time difference between the third time point T3 and the fourth time point T4, the time difference between the fourth time point T4 and the fifth time point T5, the time difference between the fifth time point T5 and the sixth time point T6, and the time difference between the sixth time point T6 and the seventh time point T7 are substantially the same. So called "substantially the same" means that the time difference between the third time point T3 and the fourth time point T4 has a ratio ranging from 0.9 to 1.1 with the time difference between the fourth time point T4 and the fifth time point T5.

As set forth above, the timing interpolation unit 1301 generates N interpolation clock signals according to the first delayed clock signal and the second delayed clock signal, and N is a positive integer larger than 1. In an embodiment, N is 2 to the power of an integer plus 1, more particularly is 2 to the power of y plus 1, where y is an amount of low bits of the clock generating signal, which is a number of bits, used for controlling the multiplexer 1302, in the clock generating signal.

More particularly, the timing interpolation unit 1301 including only the delay components 1311 to 1315 generates three interpolation clock signals according to the first delayed clock signal CLK_i and the second delayed clock signal CLK_(i+1) in an embodiment. In the embodiment shown in FIG. 6A, the timing interpolation unit 1301 generates five interpolation clock signals according to the first delayed clock signal CLK_i and the second delayed clock signal CLK_(i+1). In another embodiment, the timing interpolation unit 1301 including nine same delay components, which are disposed at a stage next to the delay components 1321 to 1329 and whose connection relationship is the same as the connection relationship of the delay components 1311 and 1329, generates nine interpolation clock signals according to the first delayed clock signal CLK_i and the second delayed clock signal CLK_(i+1).

The multiplexer 1302 selects one of the foregoing interpolation clock signals to be the output clock signal CLK_out according to the clock generating signal. In practice, the multiplexer 1302 is a multiple-input and single-output multiplexer. In the case where the foregoing timing interpolation unit 1301 outputs the interpolation clock signal CLK_int_1 to CLK_int_5 and the clock generating signal CLK_gen has 7 bits including 5 high bits for controlling the multiplex module 1200. In an embodiment, the multiplexer 1302 is a four-to-one multiplexer that receives the interpolation clock signals CLK_int_1 to CLK_int_4 through its input ends respectively and selects one of the four interpolation clock signals CLK_int_1 to CLK_int_4 to be the output clock signal CLK_out according to two low bits of the clock generating signal CLK_gen.

Figure 7A:
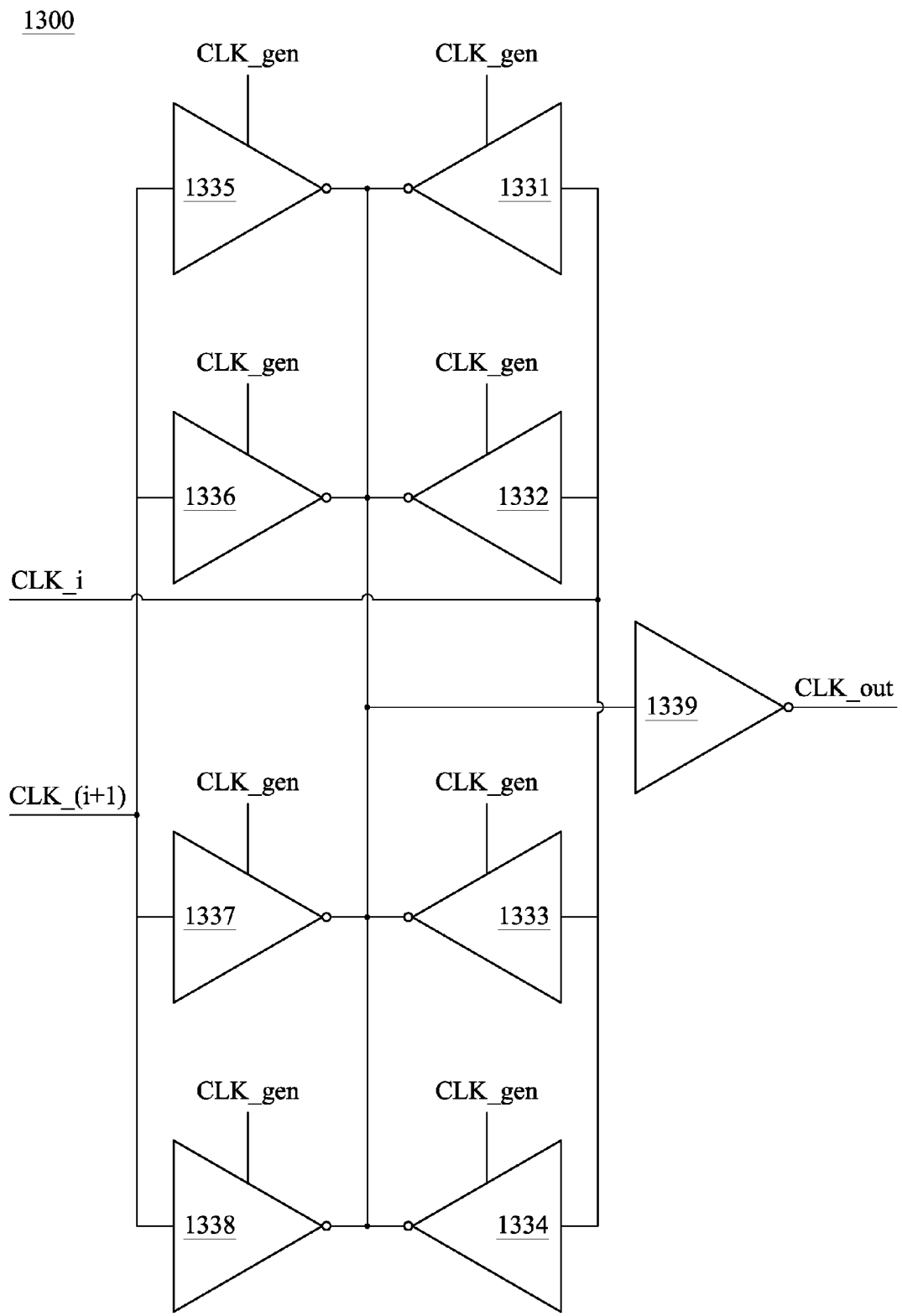
FIG. 7A is a functional block diagram of the second timing delay module according to an embodiment.
Figure 7B:
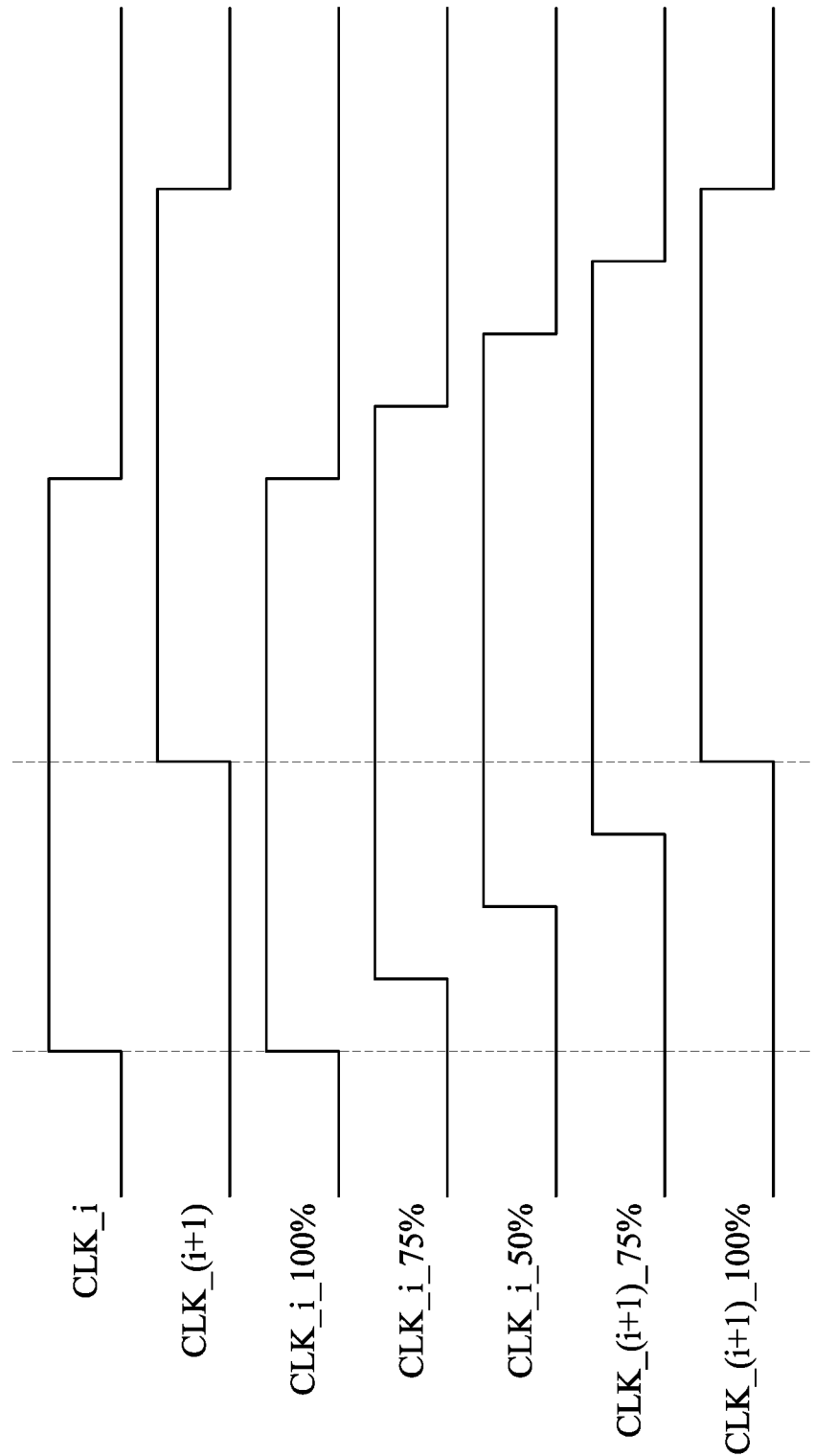
FIG. 7B is a schematic timing diagram of input and output signals of the second timing delay module in FIG. 7A according to an embodiment.

Please refer to FIGS. 7A and 7B, which are a functional block diagram of the second timing delay module 1300 and a schematic timing diagram of input and output signals of the second timing delay module 1300 in an embodiment, respectively. In FIG. 7A, the second timing delay module 1300 includes first delay components 1331 to 1334, second delay components 1335 to 1338, and a third delay component 1339. Some of the first delay components 1331 to 1334 are selectively enabled according to the clock generating signal CLK_gen, and each of the enabled first delay components then outputs a first driving signal according to the first delayed clock signal CLK_i. Some of the second delay components 1335 to 1338 are selectively enabled according to the clock generating signal CLK_gen, and each of the enabled second delay components then outputs a second driving signal according to the second delayed clock signal CLK_(i+1). The third delay component 1339 is driven by either the first driving signal or the second driving signal to generate the output clock signal CLK_out. In practice, either the first delay component 1331 or the second delay component 1335 is enabled at the same time. Similarly, either the first delay component 1332 or the second delay component 1336 is enabled at the same time, and either the first delay component 1333 or the second delay component 1337 is enabled at the same time, and either the first delay component 1334 or the second delay component 1338 is enabled at the same time. In this way, the driving force, related to the driving signal received by the third delay component 1339, changes in accordance with the variation of the clock generating signal CLK_gen, whereby the first delayed clock signal CLK_i and the output clock signal CLK_out have a different propagation delay therebetween.

In an exemplary embodiment, as shown in FIG. 7B, the second timing delay module 1300 receives the first delayed clock signal CLK_i and the second delayed clock signal CLK_(i+1). When all the first delay components are enabled by the clock generating signal CLK_gen, the output clock signal CLK_out generated by the third delay component 1339 will have a time sequence like a signal CLK_i_100%. Then, when the first delay components 1331, 1332 and 1333 and the second delay component 1338 are enabled by the clock generating signal CLK_gen herein, the output clock signal CLK_out generated by the third delay component 1339 will have a time sequence like a signal CLK_i_75% shown in FIG. 7B. When the first delay components 1331 and 1332 and the second delay components 1337 and 1338 are enabled by the clock generating signal CLK_gen herein, the output clock signal CLK_out generated by the third delay component 1339 will have a time sequence like a signal CLK_i_50% in FIG. 7B. When the first delay component 1331 and the second delay components 1336, 1337 and 1338 are enabled by the clock generating signal CLK_gen herein, the output clock signal CLK_out generated by the third delay component 1339 will have a time sequence like a signal CLK_(i+1)_75% in FIG. 7B. When all the second delay components are enabled by the clock generating signal CLK_gen herein, the output clock signal CLK_out generated by the third delay component 1339 will have a time sequence like a signal CLK_(i+1)_100% in FIG. 7B. Although in this embodiment the output clock signal CLK_out has the above five states, the disclosure has no limit on the amount of states of the output clock signal CLK_out.

As set forth above, the clock generating device employs a timing interpolation circuit to obtain a clock delay shorter than a propagation delay of one delay component. Also, the disclosure employs replicas of a delay component so that the actual clock delay of the output signal may have a certain linearity with a clock delay command indicated by the clock generating signal.

What is claimed is:
1. A clock generating device, comprising:
a first timing delay module for receiving a reference clock signal and generating a plurality of delayed clock signals associated with the reference clock signal according to the reference clock signal;
a multiplex module electrically connected to the first timing delay module, for outputting a first delayed clock signal and a second delayed clock signal among the plurality of delayed clock signals according to a clock generating signal; and
a second timing delay module electrically connected to the multiplex module, for generating an output clock signal according to the first delayed clock signal, the second delayed clock signal and the clock generating signal, wherein the second timing delay module comprises:
a timing interpolation unit electrically connected to the multiplex module, for generating a plurality of interpolation clock signals according to the first delayed clock signal and the second delayed clock signal; and a multiplexer electrically connected to the timing interpolation unit, for selecting one of the plurality of interpolation clock signals to be the output clock signal according to the clock generating signal.

2. The clock generating device according to claim 1, wherein the multiplex module is configured to select two sequential delayed clock signals of the plurality of delayed clock signals to be the first and second delayed clock signals according to the clock generating signal.

3. The clock generating device according to claim 1, wherein an amount of the plurality of interpolation clock signals is 2K+1, and K is a positive integer.

4. The clock generating device according to claim 1, wherein the plurality of interpolation clock signals has the same time interval.

5. The clock generating device according to claim 1, wherein the clock generating signal has a plurality of bits, and the multiplex module outputs the first and second delayed clock signals according to a plurality of high bits among the plurality of bits of the clock generating signal.

6. The clock generating device according to claim 5, wherein the multiplexer selects one of the plurality of interpolation clock signals to be the output clock signal according to at least one low bit among the plurality of bits of the clock generating signal.

7. The clock generating device according to claim 1, wherein the timing interpolation unit comprises:

a first delay component having a first input end and a second input end, for receiving the first delayed clock signal via the first and second input ends of the first delay component, the first delay component generating a signal associated with one of the plurality of interpolation clock signals according to the first delayed clock signal;

a second delay component having a first input end and a second input end, for receiving the first delayed clock signal via the first input end of the second delay component, and receiving the second delayed clock signal via the second input end of the second delay component, the second delay component generating a signal associated with other one of the plurality of interpolation clock signals according to the first delayed clock signal and the second delayed clock signal; and a third delay component having a first input end and a second input end, for receiving the second delayed clock signal via the first and second input ends of the third delay component, the third delay component generating a signal associated with another one of the plurality of interpolation clock signals according to the second delayed clock signal;

wherein the first, second and third delay components have the same circuit structure.

* * * * *